United States Patent [19]

Klukow

[11] 4,365,500
[45] Dec. 28, 1982

[54] WEB BENDING FIXTURE

[75] Inventor: Roger Klukow, Champlin, Minn.

[73] Assignee: Chesley F. Carlson Company, Minneapolis, Minn.

[21] Appl. No.: 230,281

[22] Filed: Jan. 30, 1981

[51] Int. Cl.³ .............................................. B21D 5/01
[52] U.S. Cl. ......................................... 72/387; 72/319
[58] Field of Search ................. 72/387, 319, 310, 308, 72/298, 305, 306, 388, 380, 321

[56] References Cited

U.S. PATENT DOCUMENTS

| | | | |
|---|---|---|---|
| 1,030,259 | 6/1912 | Wells | 72/319 |
| 1,209,415 | 12/1916 | Duncan | 72/217 |
| 1,559,180 | 10/1925 | Kelleher | 72/319 |
| 1,619,537 | 3/1927 | Parrish | 72/321 |
| 1,636,744 | 7/1927 | Johanson | 72/217 |
| 1,744,391 | 1/1930 | Kuehn | 72/319 |
| 2,234,170 | 3/1941 | Huck | 72/321 |
| 2,279,654 | 4/1942 | Carter | 72/319 |
| 2,306,595 | 12/1942 | Crowell | 72/319 |
| 2,433,319 | 9/1948 | Kilham | 72/319 |
| 2,474,683 | 6/1949 | Linder | 72/319 |
| 2,521,840 | 9/1950 | Fennell | 72/319 |
| 2,663,349 | 12/1953 | Albrecht | 72/217 |
| 3,020,590 | 2/1962 | Siegert | 72/217 |
| 3,187,542 | 6/1965 | Heller | 72/321 |
| 3,301,034 | 1/1967 | Boettcher | 72/319 |
| 3,350,912 | 11/1967 | Smith | 72/319 |
| 3,359,771 | 12/1967 | Meyerchick | 72/319 |
| 3,400,568 | 9/1968 | Brandner | 72/319 |
| 3,522,722 | 8/1970 | Goff | 72/319 |
| 3,733,872 | 5/1973 | Gregoire | 72/213 |
| 3,914,974 | 10/1975 | De Vore | 72/319 |
| 3,948,074 | 4/1976 | Stalzer | 72/319 |
| 4,181,002 | 1/1980 | Eckhold | 72/387 |

Primary Examiner—Gene Crosby
Attorney, Agent, or Firm—Dorsey & Whitney

[57] ABSTRACT

A web bending fixture to bend lithographic plates used in web offset printing and production. Precise bends are created by a precision machine tool fixture. The fixture utilizes continuously supported eccentric camming members, one on each end of the fixture, each supported by a plurality of split bearings within which the camming members rotate. After the lithographic plate is precisely aligned with unique registration means and immobilized, the camming members, are moved into position and, rotating within the bearings, form the leading and trailing edges of the plate around precisely positioned and fixed anvils.

27 Claims, 14 Drawing Figures

WEB BENDING FIXTURE

BACKGROUND OF THE INVENTION

Web offset printing and production requires precision bending of lithographic plates to assure precise alignment of the images on the plates and longevity of the plates. Plate runs can vary between twenty-five thousand to one million impressions without plate malfunction, depending in substantial part on the preparation and bending of the plate. Common problems with plates attributable to the web bending fixture utilized include plates with edges that are bent too sharply, not allowing the plate to seat naturally on the cylinder lips, plates with edges which are not bent sharply enough to fit the cylinder lips, plates which do not have parallel leading and trailing edge bends, plates that are out of register because not properly aligned prior to bending or not properly immobilized during bending, and plate lengths between bends which are too long or too short for the cylinder or plates having bent edges which are too long or too short for the cylinder because the plates were improperly positioned on the bender before bending.

Since the plate must conform precisely to the press cylinder on which it is to be utilized these problems cause the plate to be deformed when printing takes place and causes metal fatigue, normally in the area of the bends in the plate, which eventually leads to flexing, stress and eventual cracking of the plate. The actual physical formation of the bends in the plate is also of extreme importance because bending mechanisms which distort the metal when bending cause stress and stress fractures in the bend which substantially shortens the printing life of the plate. Imprecise bends, such as bends which are not straight, also lead to flexing of the plate during printing which substantially shortens the plate life.

Inventive activity has been directed to the bending of lithographic plates, most of which has incrementally improved various aspects of bending of such plates. For example, very precise bends have been achieved with bending fixtures employing the principles of a brake press where the material is clamped before bending and a bar or plate forms a precise bend at the edge of the clamp. Brake press bending, however, distorts and stretches the metal and changes the metal structure resulting in varying thicknesses of metal in the bend causing fractures and stress at the bend which shortens plate life. Other attempts have been made to resiliently form the metal around the edge of the anvil with the use of compression or tension springs. However, such springs are normally more resilient than the metal being bent and imprecise bending of the edges can occur, particularly in view of the bending pressures applied.

SUMMARY OF THE PRESENT INVENTION

The present invention incorporates an overall system approach to offset printing and as an element of that system the precision machine tool of the instant invention has been created to precisely position and bend a lithographic plate in precise alignment with previous and subsequent plates.

The invention incorporates mechanical and operational strengths to accomplish the objectives of the invention at a very high level of performance. The advantages of the invention include interrelated and interconnected mass structure that assures a solid, long term relationship of all components.

The anvils around which bends are formed are structurally and mechanically fixed to assure precise positioning of the bends on the plate. Bends in the plate are created by rolling the metal around anvils utilizing eccentric camming members which are supported throughout their length by a plurality of split bearings which provide a control of the bending operation far more effectively than conventional resilient free-bending devices.

Pursuant to the system approach there is a continuity of control from stripping to plate making in conjunction with which the plates to be bent are prepunched with a precision register punch to assure that the image registration is exact before the plate is bent. The plate is inserted onto the bed of the invention and rides on an air cushion generated through the bed. The plate is first positioned with limit switches and thereafter aligned with registration pins to assure proper registration of the plate and image after the bend has been completed. The registration pins perfectly align the image on the plate relative to the bends to be formed in the plate.

Air pressure through the table is then reversed to create a vacuum hold-down pressure. After the vacuum has been created and the plate immobilized the register pins are withdrawn from the plate and a clamping bar is applied to each end of the plate to further immobilize it and hold it precisely in position when the bend is created.

With the plate so positioned eccentric camming members precisely positioned to accommodate the radius of the anvil around which the bend is to be formed and the exact thickness of the metal or stock to be bent, rolls the metal around the anvil to form the bend. This assures a uniform thickness of metal throughout the bend without stress.

Each eccentric camming member is fully supported throughout its length by a plurality of split bearings to assure straightness of the bend and parallelism of the bends on the leading edge and trailing edge of the plate and alignment of the image to each bend.

The camming member is then reversed, a retractable anvil is withdrawn and the upper half of the bearings are raised so that the plate can be removed from the fixture without force or stress of any kind on the formed plate.

Use of this precision fixture thus produces the highest quality lithographic plate, ideally suited for the cylinder of the offset press on which the plate is to be run, the plate being capable of reproducing hundreds of thousands of impressions without costly cracking and the concomitant down time of the press that a cracked plate inherently causes.

It is therefore an object of the invention to provide a metal forming action and bending of a lithographic plate that eliminates cracking and breaking of plates on web offset presses.

It is an objective of the invention to provide a metal forming action which causes a minimum destruction of metal structure eliminating stress points and creating a uniform and maximum thickness of metal over the entire length of bends with a minimum distortion of the metal during bending.

It is an objective of the invention to create maximum straightness of bend along the entire length of bends formed on the fixture.

It is an objective of the invention to create a controlled radius of bend to permit the closest possible relationship of radius of bend of the plate to the dimensions of the cylinder upon which the plate is to be used.

It is an objective of the invention to produce parallelization of leading and trailing edge bends and parallelization of leading and trailing edge bends with the print line of the image to be reproduced.

It is an objective of the invention to control the tolerance dimension between the leading and trailing edge bends to assure proper relationship of the plate to the cylinder upon which the plate is to be used.

It is an objective of the invention to control the register of image to the bends of the plate to prevent cocked plate problems.

These and other features and objectives of the present invention will be apparent from a consideration of the accompanying description, drawings and claims.

DESCRIPTION OF THE PREFERRED EMBODIMENT

The web bending fixture 20 of the instant invention is designed for use in web offset printing and production and is particularly advantageous as part of a register control system to create repetitive impressions of images properly positioned on the paper being utilized.

The ability to properly register plates on press cylinders with a minimum of deviation accomplishes two major advantages; a minimum loss of productive press time, and a major reduction in costly paper wastage.

Register control should begin in preparatory procedures and continue to the pins 22 in the web bending fixture 20 of the instant invention. The control should begin with the punching of holes in stripping materials and in the edge of the lithographic plates 24 to be utilized. Proper registration procedures should be pursued in the stripping operation with plate frame exposure of plates 24 and in the operation known in the art as the "step and repeat" operation. These are the operations that provide the exact placement of images on the lithographic plates 24. They are of little value, however, if the control of register does not continue during the bending of the plates 24 to fit them on the press cylinder.

Figure 1:
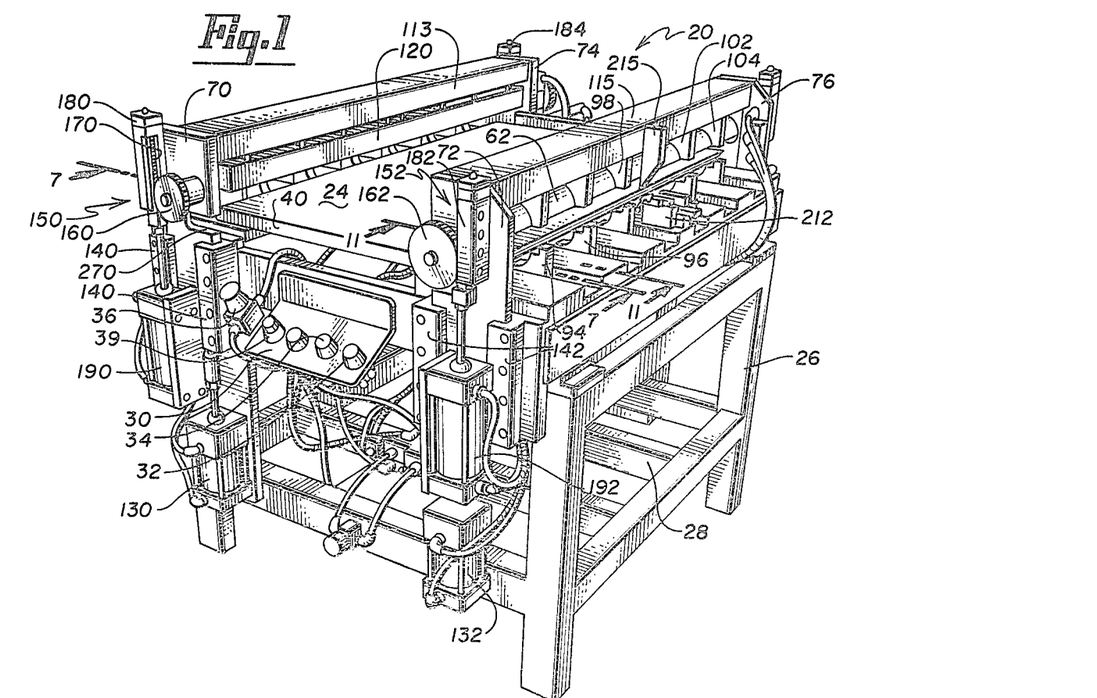
FIG. 1 is a pictorial perspective view of the invention taken from the front right corner and slightly above the fixture with the eccentric camming members in the raised or "ready" position.
Figure 2:
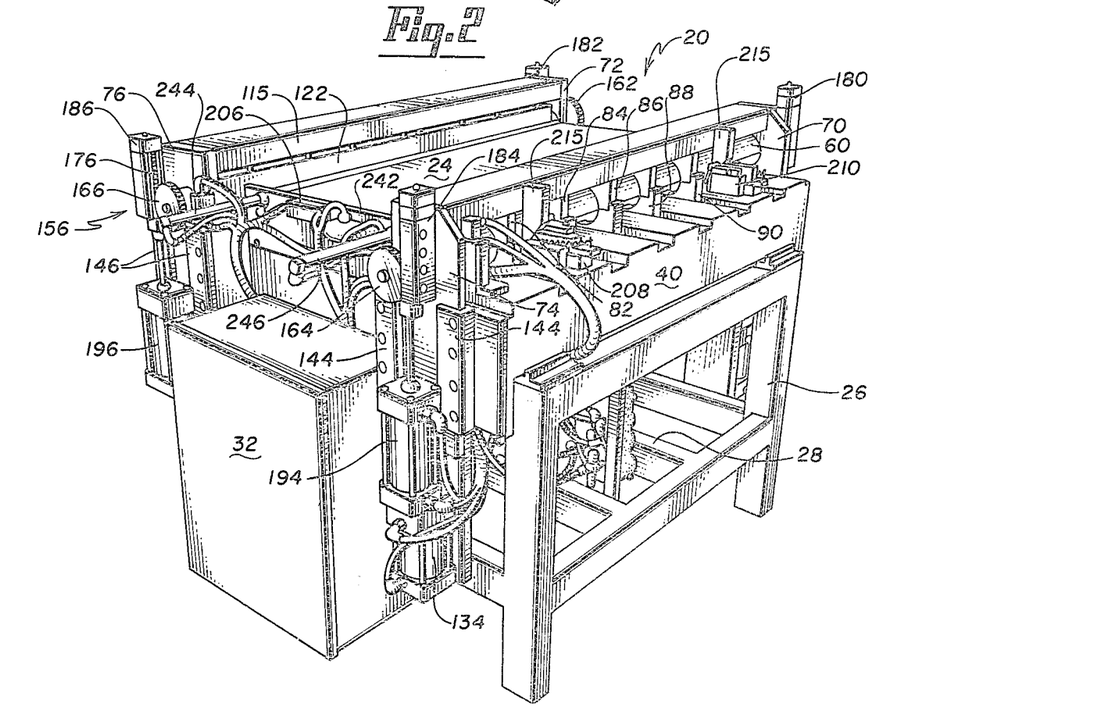
FIG. 2 is a pictorial perspective view of the fixture of FIG. 1 taken from the rear left and slightly above the fixture with the eccentric camming members in the down "clamp" and "bend" position.
Figures 3, 4, 5:
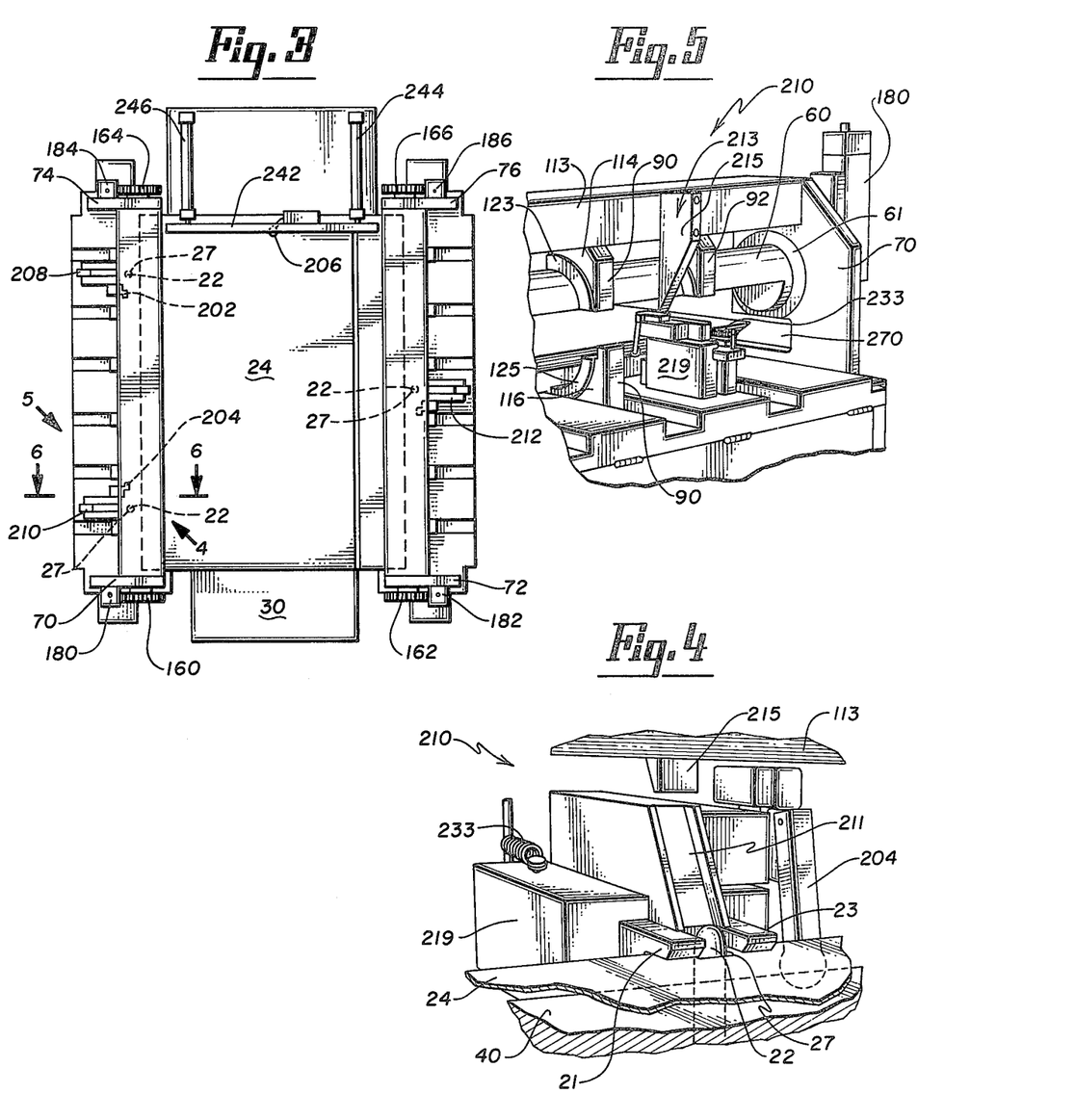
FIG. 3 is a plan view of the invention from above showing the plurality of bearings which support each camming member and the location of limit switches and registration pin mechanisms to position and align the plate before bending.
FIG. 4 is an enlarged partial pictorial detail view in perspective taken at 4 of FIG. 3 showing one of the registration pin mechanisms with associated limit switch used for alignment of the plate to assure preciseness in positioning of the bends and the image to be reproduced.
FIG. 5 is an enlarged partial pictorial detail view in perspective taken at 5 of FIG. 3 showing additional structure and operation of the registration pin mechanism of FIG. 4.

The bending of plates 24 to close tolerances requires strength and weight of the bending fixture 20. The weight of the structural elements assures a constant relationship of components and years of production without undue wear. FIGS. 1, 2 and 3 give a perspective overview of the invention. A support table 26 is provided created of heavy structural steel fixedly secured together such as by welding to provide a solid support for the bending fixture 20. A shelf 28 is conveniently provided for, in this embodiment, a vacuum pump and valving for an air logic system. Also conveniently connected to the support table is a control panel 30 and, on the other end of the table 26, shown in FIG. 2, a control box 32.

Control of the registration and bending operations is, in the preferred embodiment shown, automated with an air logic system controlling the sequential functions of the bending operation. It should be obvious that each step in the operation can be achieved manually with the invention as shown in the drawings. Those skilled in the art will realize that control of the bending fixture 20 may also be accomplished with other pneumatic controls, hydraulics or electronically with a printed circuit board or the like. The preferred embodiment uses air because of cleanliness of operation, ease and simplicity of maintenance and the ability to achieve rapid and inexpensive repairs if needed. Use of air also permits the use of NFPA interchangeable air cylinders for positioning, registration, clamping, bending and kick-out. This allows and permits the use of any other NFPA designated cylinder when a cylinder is in need of replacement which further eases the maintainability of the fixture 20.

All operating controls for the fixture 20 are preferably located on the control panel 30. Preferably the register cycle and the forming cycle, to be discussed below, are controlled by individual push buttons 32, 34, and a red "stop" button 36 is also included. Key control 39 can be provided to selectively choose automatic operation or, if preferred, manual operation, or the control panel 30 can conveniently provide manual operation only.

The basic operative elements of the invention 20 which cooperate together to provide a lithographic plate 24 ready for use on the cylinder of a web offset press are generally shown in FIGS. 1 through 3 and shown in detail in the remaining figures. The bed 40 of the fixture 20 upon which the plate 24 rests during bending is provided with a hardened anvil 42, 44 on each end, one of which 44 is retractable as shown in FIGS. 7 through 11 for removal of the plate 24 after it is bent. An air duct 50 is provided through the bed 40 which initially creates, through apertures 54, an air cushion upon which the plate 24 rides for purposes of positioning and thereafter a vacuum is created to produce a vacuum hold down feature through the apertures 54 in the bed 40.

Plates to be bent are positioned and aligned in registration with the use of limit switches and registration pins 22. Registration holes 27 in the plate 24 are to assure that the image position is in register with the bends. In some cases the bends are not to be exactly parallel to the edge of the plate 24. Thus, the plate 24 is positioned relative to the registration pins 22 with limit switches and the registration pins 22 automatically position the floating plate 24 on the bed 40 so that the bends, the print line and the image will be in exact register when bent.

Since the anvils 42, 44 are the object of all forming pressures, to assure accuracy in making the hundreds of thousands of bends of conventional aluminum plates, and stainless steel when required, the anvils 42, 44 are hardened. The anvils 42, 44 utilize a ground radius with tolerance controlled, in the preferred embodiment, to ±0.003 of an inch. This accuracy meets fully the tolerances required for proper bending of plates 24 in normal situations.

The eccentric camming members 60, 62 which roll the bends around the anvils 42, 44 are also machined to exact tolerances and hardened. Each camming member 60, 62 is rotatably secured at each end within full oilite bearings 61 in steel end plates 70, 72 and 74, 76 and both eccentric camming members 60, 62 are also fully supported throughout by a plurality of split bearings 80. As shown in FIGS. 1-3, six split bearings 82, 84, 86, 88, 90, 92 and 94, 96, 98, 100, 102, 104 are employed intermediate the ends of each camming member 60 and 62 respectively. It has been found advantageous to use four to six bearings 80 depending on the size of the plates 24 to be formed and for the largest plates 24 additional bearings 80 can be used and, in addition, additional reinforcement (not shown) can be employed in the center of the camming members 60, 62.

As shown in FIGS. 7 through 10, each of the plurality of split bearings 80 consist of a split oilite bearing surface 110, 112 each portion supported in an upper and lower bearing mount 114, 116 respectively. The lower bearing mounts 116 are fully integrated into the solid steel table 26, 40 of which the anvils 42, 44 are a part. The upper bearing mounts 114 slidably engage the lower bearing mounts 116 so that when bending pressures are applied there is no slippage or movement of the bearing mounts relative to each other. Strength of the upper bearing mounts 114 are assured by securing them to solid steel header bars 113, 115 spanning the end plates 70, 74 and 72, 76 and if further strength is necessary the upper surface of the header bars 113, 115 lend themselves to the use of a bolster bar (not shown) which can use gussets (not shown) along its length if additional strength is desired.

After the plate 24 is precisely aligned as will be described in more detail below, the plate 24 is immobilized by vacuum and by clamping members 120, 122 which engage the plate 24 upon activation of a first set of four cylinders 130, 132, 134, 136 operatively connected to the end plates 70, 72, 74, 76 to slide them in associated slide assemblies 140, 142, 144, 146. Thereafter the eccentric camming members 60, 62 are rotated with the use of four sets 150, 152, 154, 156 of rack 170, 172, 174, 176 and pinion gears 160, 162, 164, 166, one set for each eccentric camming member 60, 62, with one pinion on each end of both eccentric camming members 60, 62. Rotation of the pinion gears 160, 162, 164, 166 is accomplished with the use of the corresponding racks 170, 172, 174, 176 which one slidably engaged in slide assemblies 180, 182, 184, 186 associated with each end plate 70, 72, 74, 76 to move downward from the up or "ready" position and each actuated by a corresponding cylinder 190, 192, 194, 196.

In view of the use of air for all movement in the system automated lubrication can be achieved in the air filter operation where microscopic drops of oil can be picked up and circulated through the system as air enters the system. Air filters also remove moisture from the air stream which could be damaging to the system. To the extent possible, oilite bearings are used throughout the fixture 20 which are self-lubricating surfaces that resist wear and require no further lubrication.

Operation of the bending fixture 20 can best be understood with reference to FIGS. 7 through 10 and FIGS. 12 through 14 which detail the operational steps and the cooperation of the structural elements of the invention.

Operation of the web bending fixture 20 is preferably accomplished in three cycles, the register cycle during which the plate 24 is precisely aligned on the fixture 20, the forming cycle during which the plate 24 is precisely bent to fit the press cylinder, and a reversing cycle after which the plate 24 can be easily withdrawn from the bender 20.

The register cycle is preferably actuated with a first control button 32 which positions the retractable anvil 44 and causes an upward flow of air through the same apertures 54 that are employed during vacuum hold down of the plate 24. The retractable anvil 44 is positioned with the use of three cylinders 191 spaced along the anvil 44 each connected to an anvil cam 193 which moves upward to position the anvil 44 in the proper bend position and downward so the anvil 44 retracts. The anvil 44 is slidably mounted in the bed 40 and interconnected therewith by a plurality of bolts 195 biased by springs 197 to retract the anvil 44 when the cams 193 are withdrawn. Stability of the anvil 44 during bending is assured by a plurality of bolts 203 secured in the bed 40 the heads 205 of which are contained by bolt slots 207 which also limit lateral travel of the anvil 44. The inclined surface 209 of the cam 193 assures a precise control of anvil 44 travel, when properly adjusted, for placement of the bends and distance between the bends. The upward flow of air through the bed 40 permits floating the plate 24 onto and into the bending fixture 20 and is particularly advantageous when placing large plates 24 on the fixture 20 and has further value in the ease with which the plate 24 responds to alignment and registration prior to bending.

Positioning of the plate 24 prior to registration without visual effort results from the use of three limit switches 202, 204, 206 shown in FIG. 3. Two of the limit switches 202, 204 are cooperatively attached to the registration pin mechanisms 208, 210 as shown in FIGS. 3 and 4 and the third limit switch 206 is preferably positioned to engage a lateral side of the plate 24 as shown in FIG. 3. The three point triangulation assures a precise alignment of the plate 24 for insertion of the registration pins 22. In the preferred embodiment full contact must be established with all three limit switches 202, 204, 206 prior to registration. To be certain the plate 24 is firmly held in exact position a two second dwell time is preferably required before the registration pins 22 move upward.

Figures 6, 11, 12, 13, 14:
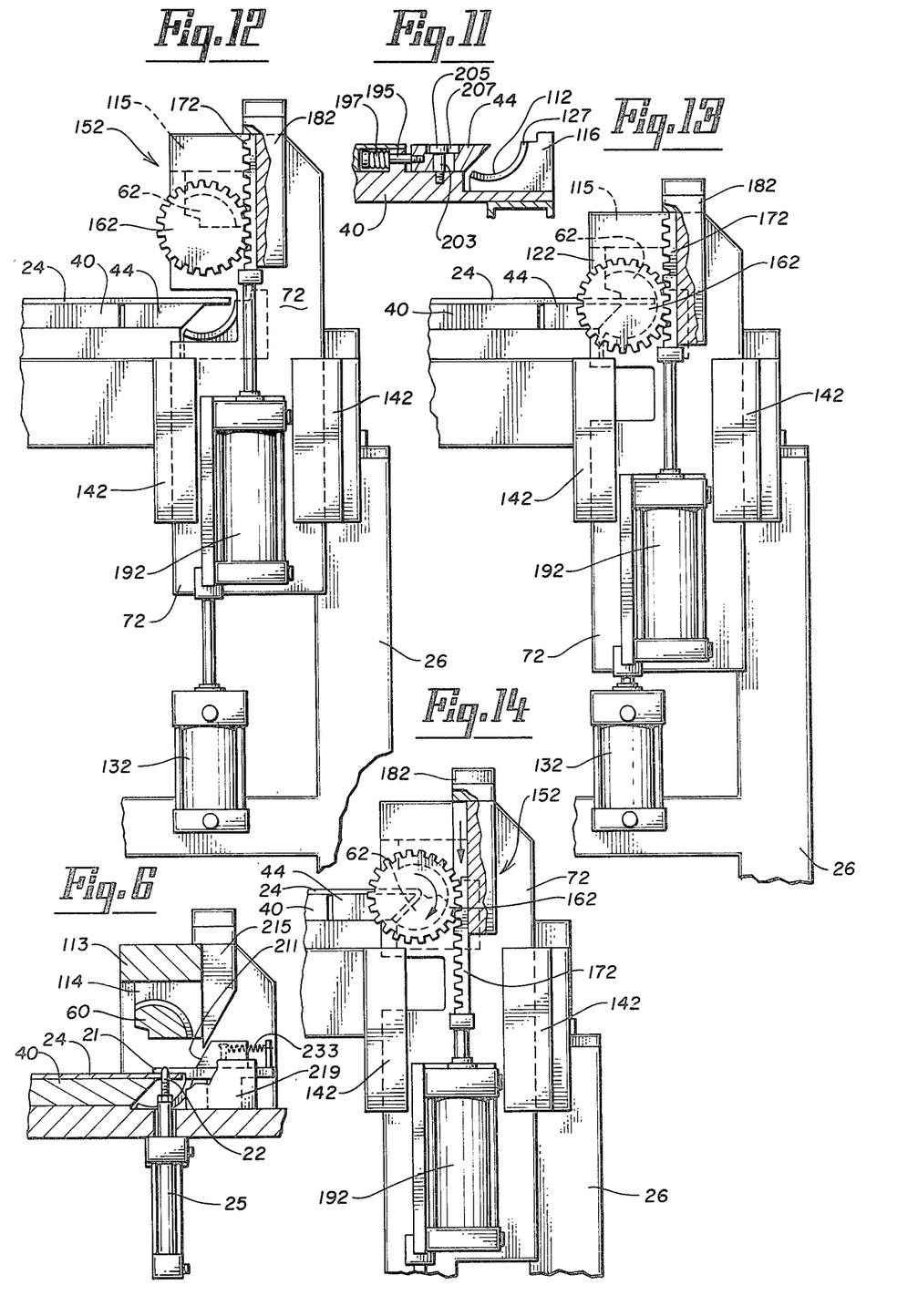
FIG. 6 is a partial elevational view of the registration pin mechanism of FIG. 4 and associated cylinder taken along the line 6—6 of FIG. 3.
FIG. 11 is a sectional detail view in elevation taken along the line 11—11 of FIG. 1 to show the structure and operation of the retractable anvil.
FIG. 12 is a partial elevational view of one of the four actuator sets, this view being the right front actuator set as shown in FIG. 1 with all elements in a raised "ready" position similar to that shown in FIG. 7.
FIG. 13 is a partial elevational view of the right front actuator set of FIG. 12 in the clamping position corresponding to FIG. 8.
FIG. 14 is a partial elevational view of the right front actuator set of FIG. 12 in a rotated bend position corresponding to FIG. 9.

When plate 24 contact is confirmed by the limit switches 202, 204, 206 the air logic system of the invention moves the registration pins 22 upward with air cylinders 25. The structural and operational detail of one 210 of the registration pin assemblies 208, 210, 212 is shown in FIGS. 4 through 6. The assembly 210, as shown, consists of the registration pin cylinder 25, which moves the pin 22 through the prepunched hole 27 in the plate 24. Straddling the pin 22 and 27 are slidably mounted containment fingers 21, 23 to prevent the plate from rising and to assure penetration of the pins 22 into the holes 27. As noted above it is the registration pins 22 which exactly align the plate 24 prior to bending so that the image is in perfect registration when used on the cylinder of the press. As shown best in FIG. 4, the increasing diameter of the rounded tip of the pins 22 incrementally moves the plate 24 into such exact alignment for perfect registration. The upward flow of air during this operation assures fast and easy movement of the plate 24 in gaining register control with the pins 22 due to the lack of surface tension between plate 24 and bed 40.

During the forming cycle, as will be discussed below, portions of the registration pin assemblies 208, 210 and 212 are moved out of the area of the bends.

In most instances two registration pin assemblies 208, 210 can be utilized, as shown in FIG. 2, to achieve lateral and longitudinal alignment since the outer diameter of the registration pins 22 correspond exactly to the inner diameter of the registration holes 27. Even more precise tolerance and alignment can be achieved with a third registration pin mechanism 212 as shown in FIGS. 1 and 3 where triangulation of the positioning assures absolute alignment of the plate 24 prior to bending.

A forming cycle is then initiated. The flow of air through the apertures 54 of the bed 40 is reversed to create a vacuum pressure to hold the plate 24 flat and firmly to the bed 40 of the bender 20. It is preferred that a sensor (not shown) be used to regulate the vacuum whereby no forming action can continue until the desired vacuum is drawn.

Figure 7:
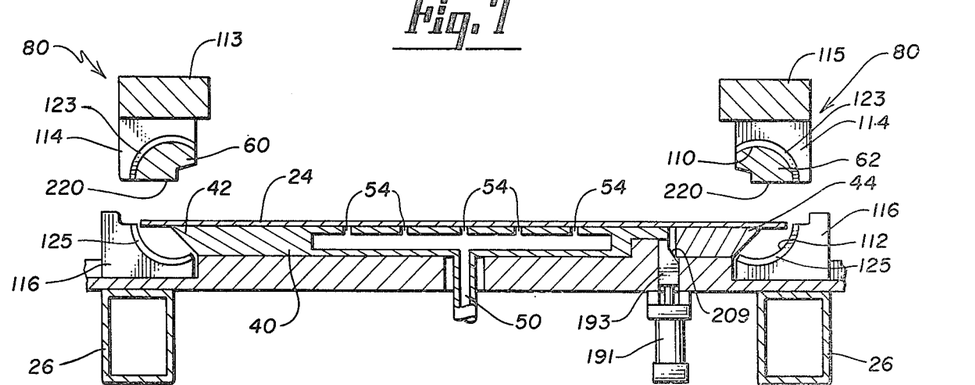
FIG. 7 is a partial sectional elevation of the machine taken along the line 7—7 of FIG. 1 with the eccentric camming members in the raised position.

When the plate 24 is immobilized in a vacuum hold the registration pins 22 are automatically withdrawn from the plate 24 by registration pin cylinders 25 and the relative position of the structural elements necessary for bending are in the "ready" position shown in FIGS. 7 and 12.

Each of the four clamping cylinders 130, 132, 134, 136 are then activated to bring down the spring loaded clamping bars 120, 122, on each end of the fixture 20. In this manner, the plate 24 is completely immobilized and solidly held during the bending operation. Since the bending cylinders 190, 192, 194, 196 are mounted on the end plates 70, 72, 74, 76 slidably mounted in the slide assemblies 140, 142, 144, 146 retraction of the shafts of the slide cylinders 130, 132, 134, 136 brings the eccentric bending members 60, 62 into position to bend as shown in FIGS. 8 and 13.

Referring to FIGS. 4 and 5 it can be seen how downward movement of the end plates 70, 72, 74 and 76 and associated header bars 113, 115 removes the registration pin mechanism containment fingers 21, 23 from the area of the bend. Integrally formed with the fingers 21, 23 is a ramp mechanism 211 channeled and positioned to receive a positioning member 213 solidly attached to the header bar 113. The positioning member 213, as shown, is a solid steel triangular finger 215 insertable in the channeled ramp 211. The fingers 21, 23 and ramp 211 are slidably mounted in a registration pin assembly block 219 which is fixed to the bed 40. Thus, downward movement of the header bar 113 and 115 causes the fingers 21, 23 to retract so that the metal 24 can be formed. As shown in FIGS. 4 and 5 the ramp 211 and finger assembly 21, 23 of each registration pin mechanism 208, 210, 212 is biased by a spring 233 to return the fingers 21, 22 and associated ramp 211 to a receiving position when the header bar 113, 115 is raised to form a new plate 24.

Returning again to FIGS. 8 and 13 and the forming cycle, with each camming member 60, 62 held solidly against the upper split bearings 114 constant alignment of each camming member 60 and 62 is assured by its pressure against the upper bearing surfaces 110 of the plurality of split bearings 80 with which it is associated. The steel support beams, the header bars 113, 115 serve to hold the upper split bearings 114 in exact and constant alignment. The camming member rotation cylinders, or bending cylinders 190, 192, 194, 196, two sets at the ends of both leading and trailing edges of the plate 24, are actuated to form the bends. The shafts of the bending cylinders 190, 192, 194, 196 are connected to racks 170, 172, 174, 176, slidably mounted in slide assemblies 180, 182, 184, 186 secured to the end plates 70, 72, 74, 76 to rotate pinion gears 160, 162, 164, 166, one at each end of both eccentric camming members 60, 62.

Figure 8:
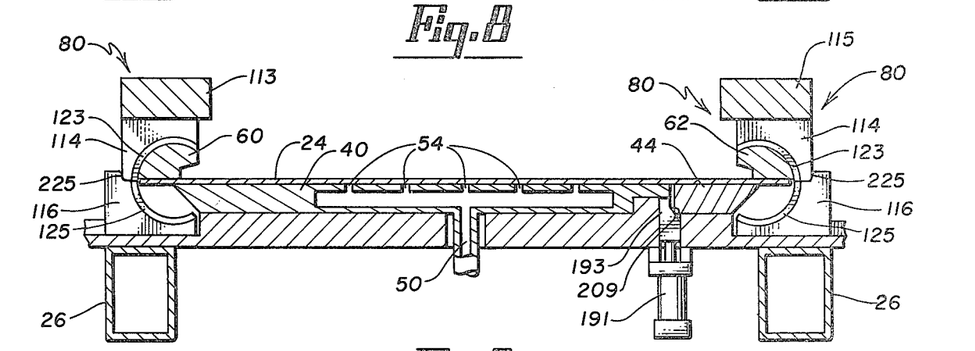
FIG. 8 is a partial sectional elevation of the invention taken along the line 7—7 of FIG. 1 with the eccentric camming members in a down clamp and bend position.
Figure 9:
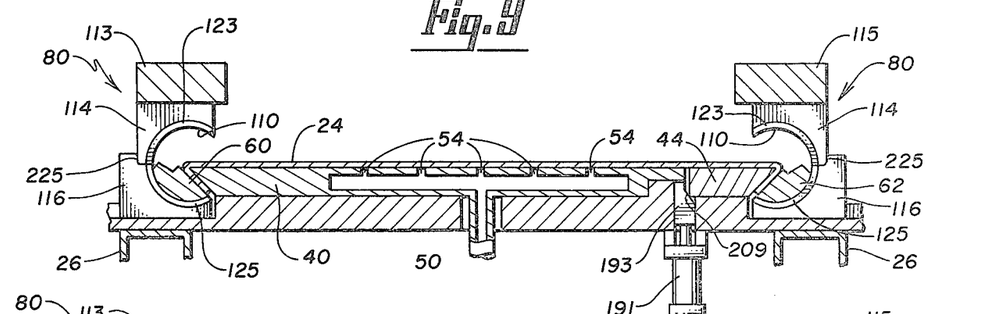
FIG. 9 is the same view as FIGS. 7 and 8 with the eccentric camming members in a rotated bend position.

As shown in FIGS. 8 and 13, the internal surface 220 of each cam 60, 62 is, when forming begins, in contact with the upper surface of the plate 24 which establishes the radius of rotation of each eccentric camming member 60, 62 as the radius of the anvil 42, 44 plus the thickness of the stock 24 being bent. At this point the split bearings surfaces 110, 112 are in full contact with each other and the bearing mounts 114, 116 are locked together by the support heel 225 on the lower split bearing mount 116 as shown in FIGS. 8 and 13. The result is perfect alignment of the split bearings 123, 125.

As each camming member 60, 62 is rotated around its respective anvil 42, 44 the metal thickness across the entire bend remains uniform because the fully supported camming members 60, 62 can provide only a perfectly straightline pressure and because the camming action is controlled precisely on the radius of the anvil 42, 44 but separated from the anvil 42, 44 by the thickness of the plate 24 being formed. This result is achieved by the alignment of the split bearings 123, 125 to provide a constant pressure at various points along the camming member 60, 62 and the plurality of split bearings 80 further establish a constant relationship of each bending member 60, 62 to its respective anvil 42, 44.

It is the constant relationship of the bending member 60 or 62 to the anvil 42 or 44 that improves the forming of metal. The use of the split bearings 80 provides the constant bearing surface 110, 112 which controls the alignment of the bending member 60, 62 relative to the plate 24 and the anvil 42, 44.

The radius of revolution of the camming members 60, 62 matches the inner radius of the split bearings 80. Thus a constant pressure is maintained by the camming member 60, 62 against the inner surfaces 110, 112 to assure straightness in bending and the upper and lower split bearing surfaces 110, 112 are in continuous contact during the bending operation to provide an extremely strong resistance to any deviation of the bending member 60, 62 during bending.

Further, precise control is achieved by precisely positioning the bending surface 220 of camming members 60, 62 away from the anvil 42, 44 to compensate for metal thickness. Maintaining this distance of the flat portion 220 of the eccentric camming member 60, 62 to the upper surface of the plate 24 assures a radius of rotation of the bending surface closest to the anvil and around the anvil to be equivalent to the radius of the anvil 42, 44 plus the thickness of the stock 24. The clearance of the camming member 60, 62 to the anvil 42, 44 is controllable to ±0.001 of an inch. In addition, if there is a substantial deviation in plate thickness the web bending fixture 20 of the instant invention may be easily modified by simply replacing the eccentric bending member 60 and 62 with equivalent members 60', 62' having bending surfaces 220, 230 machined to offset the necessary thickness.

In this manner the metal of the plate 24 is rolled or formed around the anvil 42, 44 radius without distortion, stretching or otherwise stressing the metal 24 in the bend and the plate 24 when used on a cylinder will have a uniform thickness throughout the plate 24, including a uniform metal thickness throughout the bends.

Figure 10:
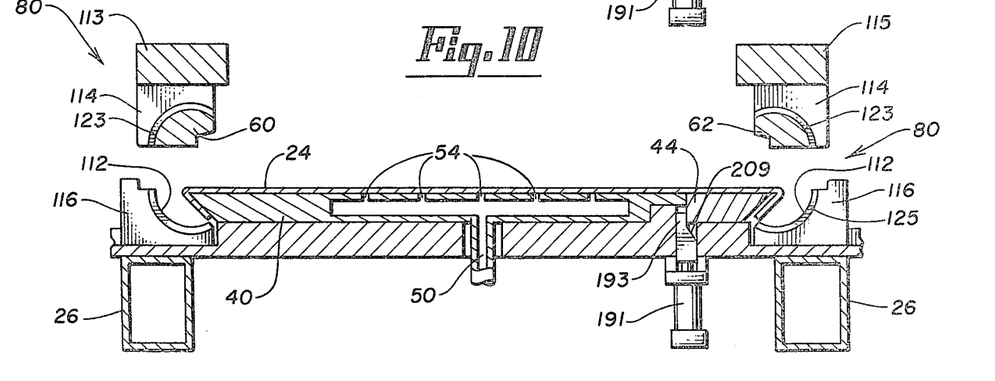
FIG. 10 is the same view as FIGS. 7 through 9 with the eccentric camming members in a raised position and with the retraction anvil retracted to allow removal of the bent lithographic plate.

After the plate 24 has been formed a reversing cycle is employed to cause reversal of the bending operation. As shown in FIG. 10, the eccentric camming members 60, 62 are rotated upward and the upper split bearings 114 are raised. The anvil 44 is retracted with the use of three retractable cams 193 activated by the cam cylinders 191 so that the plate 24 need not be forced off the anvil 42, 44. As shown in FIG. 11 and previously described the retraction anvil 44 is spring biased with springs 197 to retract the anvil 44 when the anvil cams 193 are withdrawn. An automatic eject mechanism 240 is also conveniently provided as shown in FIGS. 2 and 3 consisting of an eject bar 242 activated by two cylinders 244, 246 which slide the plate 24 off the bed 40. At this point the plate 24 is perfectly formed, is not subject to any pressures and can be easily withdrawn from the bending fixture 20 through apertures 270, 272 provided in the end plates 70, 72 for this purpose.

In summary, operation of the fixture 20 is as follows: an air cushion is established through apertures 54 in the bed 40, and the retractable anvil 44 is positioned at the proper position for the bend which has been previously established according to the thickness of the plate 24 to be bent and the desired distance between bends. The plate 24 is placed on the bed 40 and moved to three limit switches 202, 204, 206. Contact by the plate 24 with all three limit switches 202, 204, 206 causes registration pins 22 associated with two 208, 210 or three 208, 210, 212 registration pin mechanisms to exactly align the plate 24.

Forming of the plate 24 then takes place providing the plate 24 has been properly positioned with the register pins 22. The air cushion is withdrawn and a vacuum is established. When the vacuum is established the registration pins 22 are withdrawn and the four slide cylinders 130, 132, 134, 136 go down to further immobilize and clamp 120, 122 the plate 24 in position for the bend.

When the slide cylinders 130, 132, 134, 136 are down the four cylinders 190, 192, 194, 196 associated with the eccentric camming elements 60, 62 go down to form the plate 24 around the anvils 42, 44.

After the bends are formed in the plate 24 the four cylinders 190, 192, 194, 196 for the cams 60, 62 go up to reverse the camming elements 60, 62 and return the camming elements 60, 62 to the upper split bearings 114. When the camming elements 60, 62 are reversed, the four cylinders 130, 132, 134, 136 for the end plates 70, 72, 74, 76 go up to raise the clamping bars 120, 122, and the upper split bearings. The anvil cylinders 191 are then withdrawn to retract the retractable anvil 44. When the anvil cams 193 and cylinders 191 are withdrawn two additional cylinders 244, 246 for ejection eject the plate 24 through the apertures 270, 272 in the end plates 70, 72 at approximately four to five seconds per six inches and retract. After the ejection cylinders 244, 246 are retracted and plate 24 is removed the bending fixture 20 is ready to accept a new plate 24 for bending. If automated for sequential operations, this entire operation takes no more than fifteen seconds from initial contact of the plate 24 to the limit switches 202, 204, 206 to ejection of the perfectly formed lithographic plate 24.

In general, while I have described a specific embodiment of my invention, it is to be understood that this is for purposes of illustration only and that various modifications can be made within the scope of the invention as set forth by the following claims.

I claim as my invention:

1. A web bending fixture for bending plates of metal having a leading edge and a trailing edge comprising:
    a bed to support the plate to be bent;
    at least one anvil having a bending radius at the edge of the bed;
    at least one eccentric camming member having a bending surface positioned relative to the anvil to bend one of the edges of the plate around the bending radius of the anvil;
    a full bearing supporting each end of the eccentric camming member for rotation;
    a plurality of additional bearings intermediate the ends of the eccentric camming member within which the eccentric camming member is rotatably contained during rotation, the additional bearings being spaced along the length of the eccentric camming member to radially support the eccentric camming member throughout its length; and
    means for rotating the eccentric camming member around the bending radius of the anvil, the closest point on the bending surface of the eccentric camming member being spaced from the anvil at all times during rotation a distance equivalent to the thickness of the plate being bent.

2. The web bending fixture of claim 1 wherein two anvils are provided, at opposing ends of the bed, to bend both the leading edge and the trailing edge of the plate and wherein an eccentric camming member is positioned adjacent each anvil to form both the leading edge and the trailing edge of the plate, each eccentric camming member having a bending surface, the closest point on which is spaced from the adjacent anvil during bending a distance equivalent to the plate being bent.

3. The web bending fixture of claim 2 wherein one of the anvils is retractable for purposes of removing the plate from the bed of the web bending fixture.

4. The web bending fixture of claim 1 further comprising means to position the plate on the bed of the web bending fixture.

5. The web bending fixture of claim 4 wherein the means to position the plate comprise apertures in the bed of the web bending fixture through which air is passed to provide an air cushion upon which the plate can ride during positioning.

6. The web bending fixture of claim 4 wherein the means to position the plate comprise a plurality of limit switches to determine when the plate is in position.

7. The web bending fixture of claim 6 wherein at least three limit switches are utilized to position the plate on the bed of the web bending fixture.

8. The web bending fixture of claim 4 wherein the plate has a plurality of registration holes prepunched in the plate before bending and wherein the means to position the plate prior to bending comprise registration pin mechanisms having registration pins for insertion into the registration holes.

9. The web bending fixture of claim 8 wherein at least two registration pin mechanisms are utilized to locate and fix the plate relative to two registration holes.

10. The web bending fixture of claim 8 wherein at least three registration pin mechanisms are utilized, two on one edge of the plate and one on the opposing edge of the plate to precisely position the plate relative to the bends to be made by the web bending fixture.

11. The web bending fixture of claim 8 further comprising:
an end plate on each end of the eccentric camming member containing the full bearings which support each end of the eccentric camming member for rotation;
a header bar secured between the end plates; and
wherein each registration pin mechanism comprises:
a registration pin having a rounded tip for insertion into the registration hole;
means for inserting and withdrawing the registration pin into and out of the registration hole;
a block fixed to the bed adjacent the registration hole in the plate;
a set of containment fingers for straddling the registration hole above the plate and being slidably mounted in the block;
a ramp mechanism secured to the containment fingers slidably movable therewith and positioned above the containment fingers;
positioning means attached to the header bar above the ramp mechanism, said header bar and positioning means being vertically movable so that the positioning means when moved downwardly engages the ramp to slide it and the associated containment fingers rearwardly away from the registration hole and edge of the plate; and
biasing means attached to the block and to the containment fingers and associated ramp to bias the fingers and associated ramp toward the edge of the plate so that when the positioning means moves upwardly the containment fingers and associated ramp move forwardly toward the adjacent registration hole and edge of the plate.

12. The web bending fixture of claim 1 further comprising means to secure the plate to the bed of the web bending fixture prior to bending.

13. The web bending fixture of claim 12 wherein the means to secure the plate to the bed comprises apertures through the bed of the web bending fixture through which air is drawn to create a vacuum.

14. The web bending fixture of claim 12 wherein the means to secure the plate to the bed of the web bending fixture comprise clamp means to hold the plate to the bed of the web bending fixture.

15. The web bending fixture of claim 1 wherein the plurality of additional bearings are split bearings comprising upper bearings carried by upper bearing mounts and lower bearings carried by lower bearing mounts secured to the bed of the web bending fixture.

16. The web bending fixture of claim 15 wherein the upper bearing mounts and lower bearing mounts are secured together during the bending to provide the plurality of additional bearings, each additional bearing having a continuous bearing surface during the bending of the plate by the web bending fixture.

17. The web bending fixture of claim 16 further comprising:
an end plate on each end of the eccentric camming member each end plate containing the full bearing supporting the end of the eccentric camming member;
a header bar secured between the end plates;
a first motive means connected to the end plates to vertically move the end plates and header bar upwardly and downwardly and wherein the upper bearing mounts are secured to the header bar so that when the end plates and header bar is moved downwardly the upper bearing mounts and lower bearing mounts are secured together to provide the continuous bearing surfaces.

18. The web bending fixture of claim 1 wherein at least four bearings are positioned intermediate the ends of the eccentric bending member to support the eccentric bending member during bending.

19. The web bending fixture of claim 1 wherein six bearings are provided intermediate the ends of the eccentric bending member to support the eccentric bending member during bending.

20. The web bending fixture of claim further comprising:
an end plate on each end of the eccentric camming member;
a header bar secured between the end plates;
a plurality of upper split bearing mounts having upper bearing surfaces secured to the header bar;
a plurality of lower split bearing mounts having lower bearing surfaces secured to the bed;
means for slidably attaching the end plates to the bed of the web bending fixture;
clamp means operatively secured to the header bar;
first motive means connected to the end plates to slide the clamp means into engagement with the plate to clamp the plate to the bed of the web bending fixture and to slide the upper split bearing mounts into a secured engagement with the lower split bearing mounts to provide the plurality of additional bearings and so that a plurality of continuous bearing surfaces are provided to support the eccentric camming member during rotation; and second motive means connected to the means for rotating the eccentric camming member so that a bend is formed in the edge of the plate.

21. The web bending fixture of claim 20 wherein the first motive means comprises a set of cylinders, one associated with each end plate and connected to raise and lower the end plate.

22. The web bending fixture of claim 20 wherein the means for rotating the eccentric camming member comprises a rack and pinion gear on each end of the eccentric camming member.

23. The web bending fixture of claim 22 wherein a rack is slidably mounted on each end plate.

24. The web bending fixture of claim 23 wherein the second motive means comprises a set of cylinders, one on each end of the eccentric camming member and mounted on each end plate and connected to each rack so that when the racks are moved they rotate the associated pinion gears.

25. The web bending fixture of claim 20 further comprising means for retracting the anvil after a bend is formed in the plate so that the plate can be removed from the web bending fixture.

26. The web bending fixture of claim 25 wherein the anvil is slidably attached to the bed and movable between a bending position and a retracted position and wherein the means for retracting the anvil comprise:
- a set of three vertically movable cams positioned behind the anvil so that when in their upward position they slide the anvil forward to the bending position and when in their downward position allow the anvil to retract;
- third motive means connected to the cams to move the cams up to slide the anvil to the bending position and to move the cams down so the anvil can be retracted; and
- biasing means between the bed and the anvil to retract the anvil when the cams are moved by the motive means to the downward position.

27. A web bending fixture for bending plates of metal having an image thereon and a leading edge and a trialing edge comprising:
- a bed to support the plate to be bent;
- two anvils at opposing ends of the bed, each having a bending radius at the edge of the bed;
- a set of two eccentric camming members, one associated with each anvil, each eccentric camming member having a bending surface positioned relative to the adjacent anvil to bend one of the edges of the plate around the bending radius of the anvil;
- two sets of end plates, one set associated with each eccentric camming member to provide an end plate on each end of each of the eccentric camming members, each end plate having a full bearing mounted therein for supporting the end of the eccentric camming member with which it is associated for rotation;
- a header bar secured between each of the two sets of end plates;
- a plurality of upper split bearing mounts having upper bearing surfaces secured to each header bar;
- a plurality of lower split bearing mounts having lower bearing surfaces secured to the bed below each header bar;
- means for slidably attaching the end plates to the bed of the web bending fixture in a manner that they can be moved upwardly and downwardly;
- means for positioning a plate on the bed;
- means for aligning the plate on the bed so that the image on the plate is in registration with the bends to be formed in the plate;
- clamp means operatively secured to each header bar;
- a first set of four cylinders, one connected to each end plate to vertically move the end plates downwardly so that the clamp means clamp the leading edge and trailing edge of the plate to the bed of the web bending fixture and so that the upper split bearing mounts are moved into a secured engagement with the lower split bearing mounts to provide a plurality of additional bearings intermediate the ends of each of the eccentric camming members each of the plurality of additional bearings having a continuous bearing surface when secured together to support each eccentric camming member throughout its length during rotation;
- means for rotating each of the eccentric camming members around the bending radius of the adjacent anvil so that the closest point on the bending surface of each eccentric camming member is spaced from the adjacent anvil at all times during rotation a distance equivalent to the thickness of the plate being bent, said means for rotating the eccentric camming member comprising:
  - a rack and pinion gear associated with each end of each eccentric camming member; and
  - a second set of four cylinders, one on each end plate and connected to the racks to slidably move each rack in a downward direction so that the associated pinion gears rotate the eccentric camming members so that a bend is formed in the leading edge and the trailing edge of the plate; and means for removing the formed plate from the fixture.

* * * * *

UNITED STATES PATENT AND TRADEMARK OFFICE
CERTIFICATE OF CORRECTION

PATENT NO. : 4,365,500
DATED : December 28, 1982
INVENTOR(S) : Roger Klukow

It is certified that error appears in the above—identified patent and that said Letters Patent is hereby corrected as shown below:

The first line of claim 20 should be:

20. The web bending fixture of claim 1 further comprising:

Signed and Sealed this

Twenty-fifth Day of October 1983

[SEAL]

Attest:

GERALD J. MOSSINGHOFF

*Attesting Officer*     *Commissioner of Patents and Trademarks*